US007187062B2

(12) United States Patent
Frank

(10) Patent No.: US 7,187,062 B2
(45) Date of Patent: Mar. 6, 2007

(54) COUPLER DETECTOR

(75) Inventor: Michael Louis Frank, Los Gatos, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 56 days.

(21) Appl. No.: 10/824,696

(22) Filed: Apr. 14, 2004

(65) Prior Publication Data

US 2005/0231302 A1 Oct. 20, 2005

(51) Int. Cl.
*H01L 29/40* (2006.01)
*G01R 1/24* (2006.01)

(52) U.S. Cl. ................ 257/664; 324/147; 257/E27.001

(58) Field of Classification Search ................ 257/664; 324/126

See application file for complete search history.

(56) References Cited

U.S. PATENT DOCUMENTS

| | | | | | |
|---|---|---|---|---|---|
| 3,500,255 | A | * | 3/1970 | Ho et al. | 333/116 |
| 4,789,887 | A | * | 12/1988 | Crossley et al. | 257/621 |
| 5,001,399 | A | * | 3/1991 | Layden | 315/105 |
| 5,036,229 | A | * | 7/1991 | Tran | 327/536 |
| 5,105,171 | A | | 4/1992 | Wen et al. | |
| 5,313,175 | A | * | 5/1994 | Bahl et al. | 333/116 |
| 5,378,939 | A | | 1/1995 | Marsland et al. | |
| 5,508,630 | A | | 4/1996 | Klemer et al. | |
| 5,658,132 | A | * | 8/1997 | Akazawa et al. | 417/45 |
| 5,786,992 | A | * | 7/1998 | Vinciarelli et al. | 363/89 |
| 5,832,374 | A | * | 11/1998 | Birth et al. | 455/127.2 |
| 5,960,333 | A | * | 9/1999 | Repke et al. | 455/91 |
| 6,002,375 | A | * | 12/1999 | Corman et al. | 343/853 |
| 6,542,375 | B1 | | 4/2003 | Kuitenbrouwer et al. | |
| 7,034,633 | B2 | * | 4/2006 | Passiopoulos et al. | 333/116 |
| 2005/0073373 | A1 | | 4/2005 | Dupont et al. | |

FOREIGN PATENT DOCUMENTS

| | | | |
|---|---|---|---|
| EP | 0364879 | | 4/1990 |
| EP | 0511728 | | 4/1992 |
| EP | 1 521 363 | | 4/2005 |
| JP | 2003-324326 | * | 11/2003 |

OTHER PUBLICATIONS

Definition of "charge pump" retrieved from "http://en.wikipedia.org/wiki/Charge_pump" on Oct. 7, 2005, 1 page.*
Kumar et al., "Monolithic GaAs Interdigitated Couplers", IEEE Transactions on Electron Devices, vol. ED-30, No. 1, Jan. 1983.*
L. Pylarinos, "Charge Pump: An Overview", downloaded from internet, date unknown, 7 pages.*
J. Abrokwah et al., "GaAs Integrated Passive Technology at Freescale Semiconductor, Inc.", International Conference on Compound Semiconductor Manufacturing Technology, Aug. 2005, 4 pages.*
Wikipedia, "Chemical element", downloaded from internet Jun. 2006, 5 pages.*
Search Report for GB Application No. GB0505776.5 dated May 18, 2005.
Examination Report for British Patent Application No. 0505776.5 dated Oct. 8, 2006.

* cited by examiner

*Primary Examiner*—Evan Pert

(57) ABSTRACT

The present invention is a coupler built on a semiconductor substrate, e.g. GaAs. Semiconductor processing allows for small trace and space rules. The tighter design rules provide for tighter coupling than can be achieved by ceramic processes. The greater coupling allows for a shorter through line and with less loss, thus closer to ideal coupling.

5 Claims, 6 Drawing Sheets

Figure 3 Ideal and Ceramics Couplers

COUPLER DETECTOR

BACKGROUND

Cellular phone handsets are required to set transmit power to within a specified precision. There are two predominant techniques. The first is the in factory calibration performed when the handset is being manufactured. In calibration, the handset is measured to ascertain the output power under various circumstances, and a table of the results is generated and stored within the handset. This table is used to set the power per the direction of the system. The accuracy of the power setting is then determined by how thoroughly this calibration is accomplished. This technique is not capable of responding to changes in the performance of the handset.

The second technique is sample and detect. The power out of the transmit portion is sampled and detected. The second technique requires a coupler, detector, and signal processing to measure the detected voltage as will be further described. This requires that a form of calibration be performed, but the detection circuit will accurately reflect any subsequent changes in the performance of the handset.

FIG. 1 schematically illustrates how a coupler works. Any two conductors, e.g. transmission lines, sufficiently near one another will function as a coupler. Power delivered into a first transmission line will couple into a parallel second transmission line, and flow in a direction opposite to that in the first transmission line. The amount of coupling is a function of the separation between the two transmission lines and the multiple of wavelengths that the separation embodies.

FIG. 2 illustrates a dual directional coupler. The coupler can detect both incident and reflected power.

Using either prior art coupler, the detected power is then delivered to a detector diode. The diode rectifies the power and generates a DC level. This DC level is processed according to the system needs. The detected value is used to adjust the power level as required.

The process technology used to implement the coupler sets the minimum separation between the through conductor, e.g. first transmission line, and the coupled conductor, e.g. second transmission line. This minimum separation determines the minimum length to achieve the desired coupling. To illustrate, driving a diode directly requires about 15 dBm at 1 to 2 GHz, the range of interest for handsets. If the amplifier is transmitting 1 W (30 dBm), then the coupler must provide 15 dB of coupling. This requirement sets the minimum length of the coupler in any particular process technology.

There are two loss mechanisms in a coupler. The first is the ideal loss associated with the coupled power. This power leaves the through path and enters the coupled path. When half the power is coupled in a 3 dB, the through loss is at least 3 dB. In a 15 dB coupler, the through loss is at least 0.14 dB.

The second loss mechanism is resistive. The metals and dielectrics used in a coupler are inherently lossy. Consequently, the longer the through transmission line is the higher the loss. FIG. 3 shows the ideal coupler loss vs. coupling for a commercially available ceramic coupler supplied by AVX Inc.

Couplers are available in many form factors. The largest are instrument grade, made of machined metal, operable over many octaves. The smallest are built on ceramic, covering perhaps one octave usefully, e.g. small ceramic AVX 15 dB coupler having 0.35 dB loss at 2 GHz. To implement the detector function, the circuit includes the ceramic coupler, external diodes, a biasing network for the diodes, bypass capacitors, and terminating resistors, if needed. The resulting network is large and unwieldy.

SUMMARY

The present invention is a coupler and detector integrated on a semiconductor substrate, e.g. gallium arsenide or silicon. Semiconductor processing allows for small trace and space rules. The tighter design rules provide for tighter coupling than can be achieved by ceramic processes. The greater coupling allows for a shorter through line and with less loss, thus closer to ideal coupling. The semiconductor substrate supports the addition of whatever supporting components are required to complete the detecting function, such as diodes, transistors, resistors, capacitors and interconnections.

DETAILED DESCRIPTION

Figure 1:
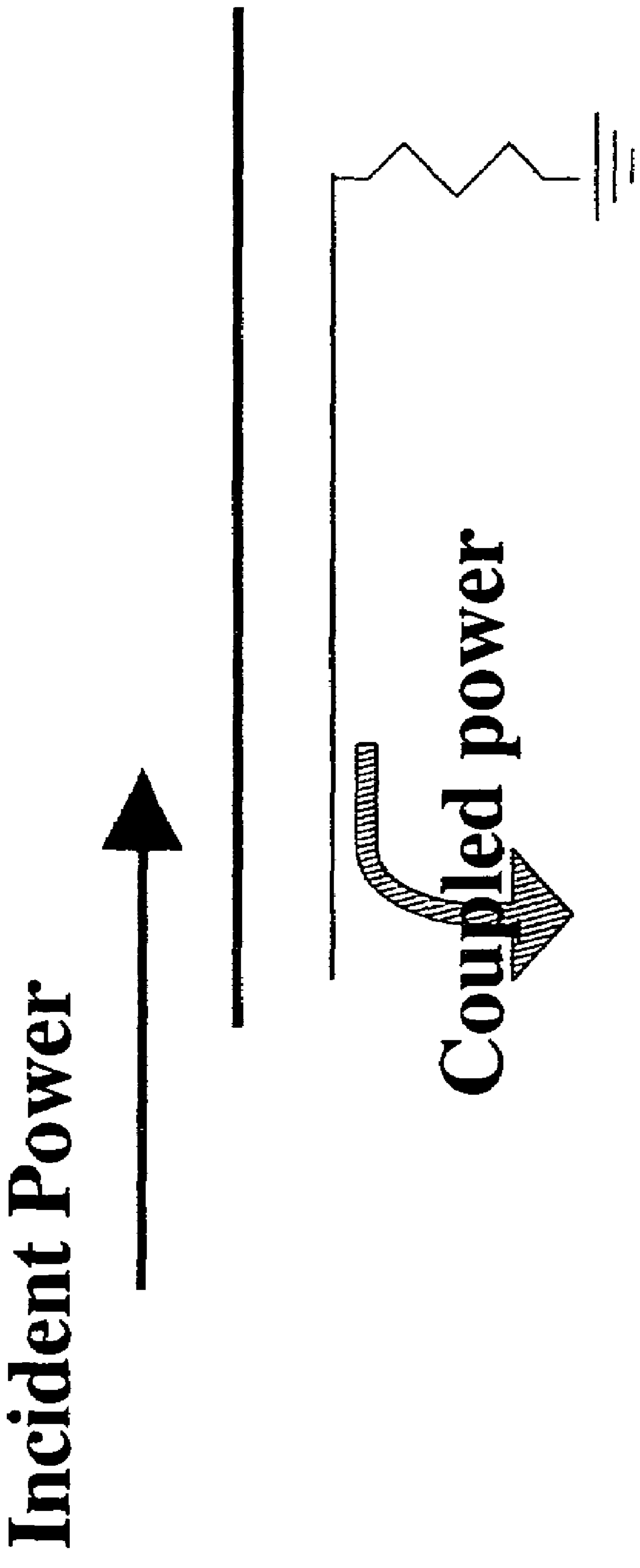
Figure 1 (Prior Art)
FIG. 1 schematically illustrates how a coupler works.
Figure 2:
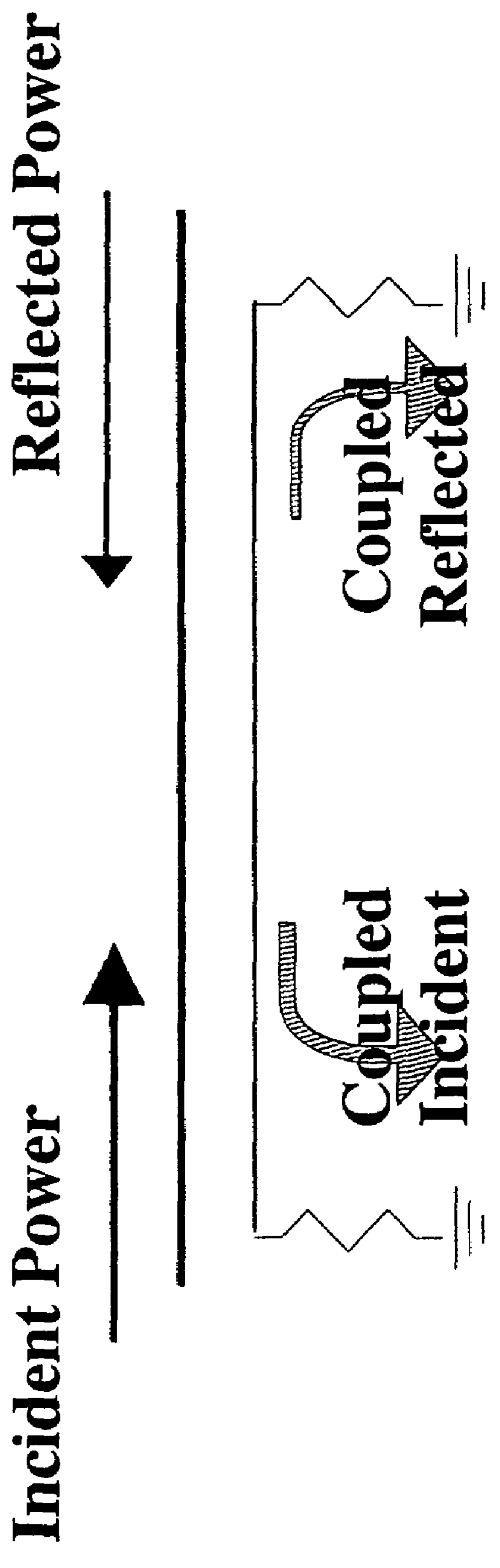
Figure 2 (Prior Art)
FIG. 2 illustrates a dual directional coupler of the prior art.
Figure 3:
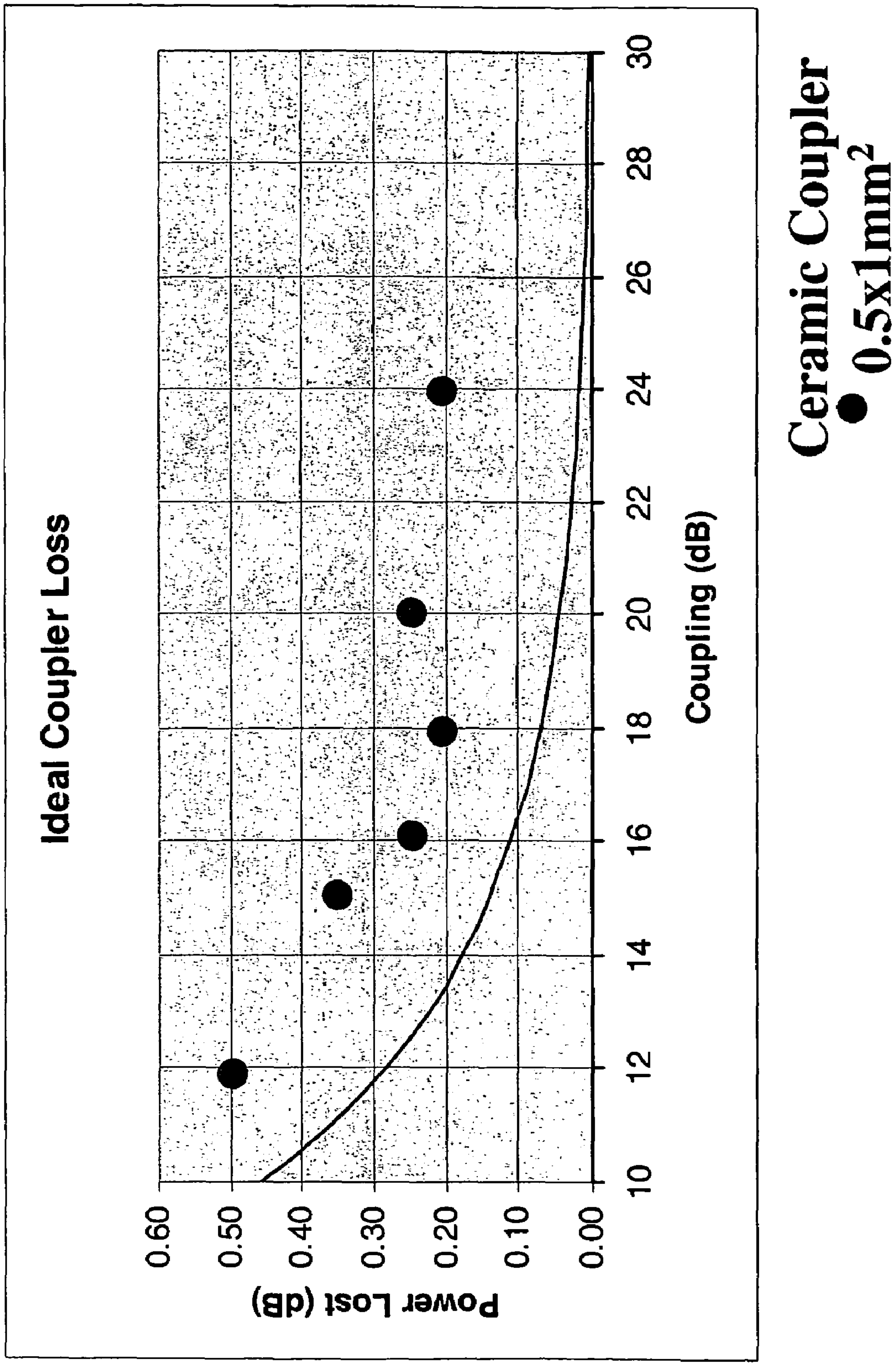
FIG. 3 shows the ideal coupler loss vs. coupling for a commercially available ceramic coupler.

The present invention is a coupler and detector integrated on a semiconductor substrate, e.g. GaAs. Semiconductor processing allows for small trace and space rules on the order of less than 3 μm horizontal and less than 1 μm vertical. The tighter design rules provide for tighter coupling than can be achieved by ceramic processes. The greater coupling allows for a shorter through line and with less loss, thus closer to ideal coupling.

The entire circuitry for detecting power may be fabricated on the same die. This provides two benefits. First, it greatly reduces the size of the detection function. Second, it supplies a new design regime wherein coupler loss can be traded off with bias current to increase the overall efficiency of the handset.

As an example, to provide 1 W (30 dBm) from a 50% efficient power amplifier, 571 mA from a 3.5 V supply is required when there is no coupler. If the 15 dB coupler has 0.35 dB of loss, the amplifier must deliver 30.35 dBm, at the cost of 619 mA. Thus, the coupler requires an additional consumption of 48 mA. Because one can integrate the coupler and detector, the loss in the coupler can be reduced while the detected output can be maintained. For instance, if the loss is reduced to 0.15 dB, resulting in a coupling of 25 dB, one can use a 10 dB amplifier to bring the equivalent coupling back to 15 dB. The power amplifier is now required to provide 30.15 dBm, and so requires 591 mA. This amplification would require perhaps 3 mA, substantially less than the 28 mA difference between 619 mA and 591 mA.

The power detection function is made significantly smaller and more efficient by using an active semiconductor substrate, e.g. GaAs. This substrate can contain the coupler, the detector diodes, the required passive devices for biasing and bypassing, and transistors for amplification.

Figure 4:
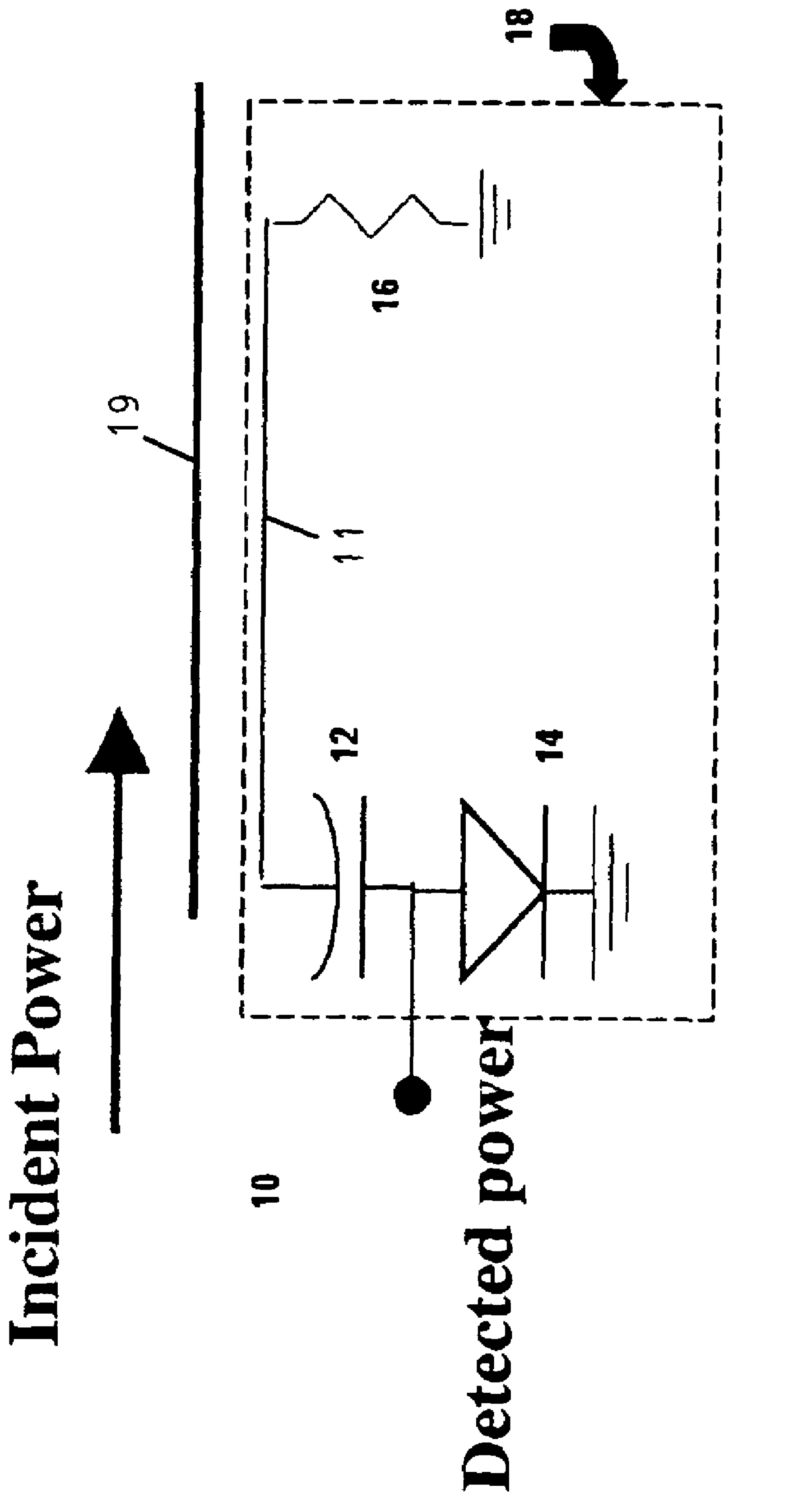
FIG. 4 illustrates an embodiment of the present invention.

FIG. 4 illustrates an embodiment of the present invention 10. A conductor 11 is serially connected to a capacitor 12 and then a detector diode 14. The conductor 11 is further connected to a terminating resistor 16. The conductor 11, capacitor 12, detector diode 14, and terminating resistor 16 are integrated on a unitary semiconductor substrate 18. A conductor 19 is located above substrate 18 and aligned with conductor 11. Conductors 11 and 19 form a coupler for detecting power transmitted through conductor 19.

Figure 5:
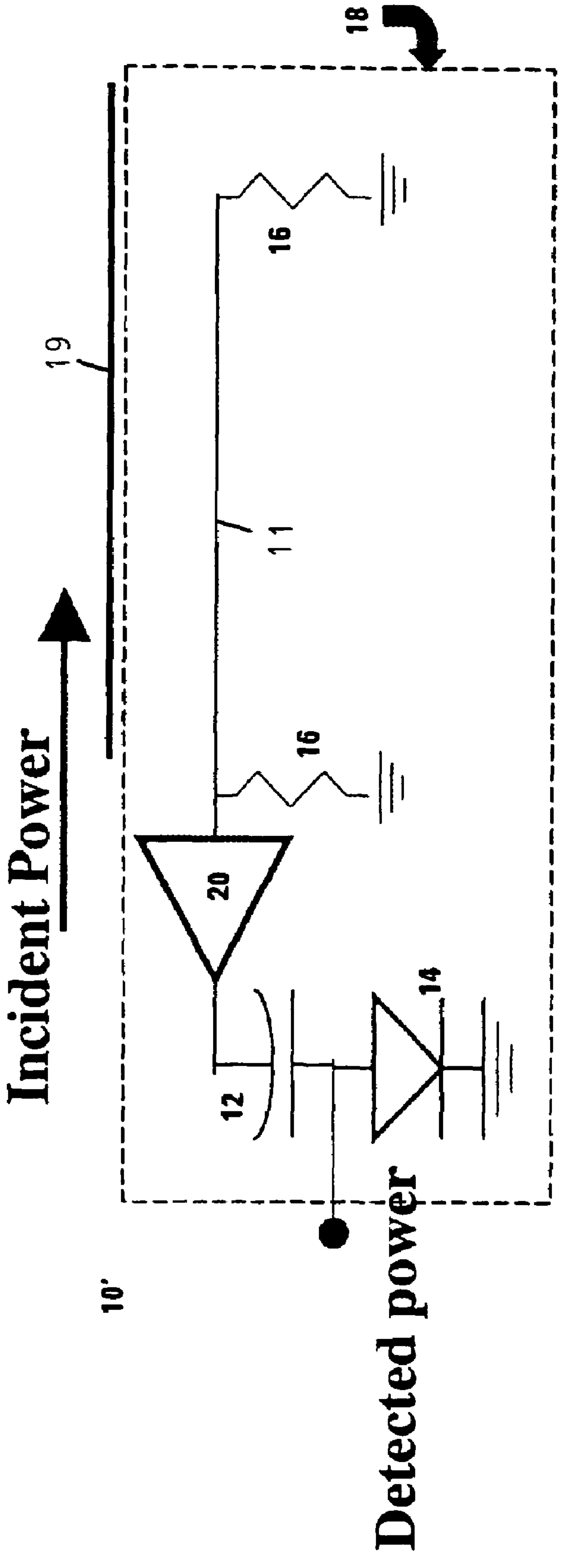
FIG. 5 illustrates an alternate embodiment of the present invention.
Figure 6:
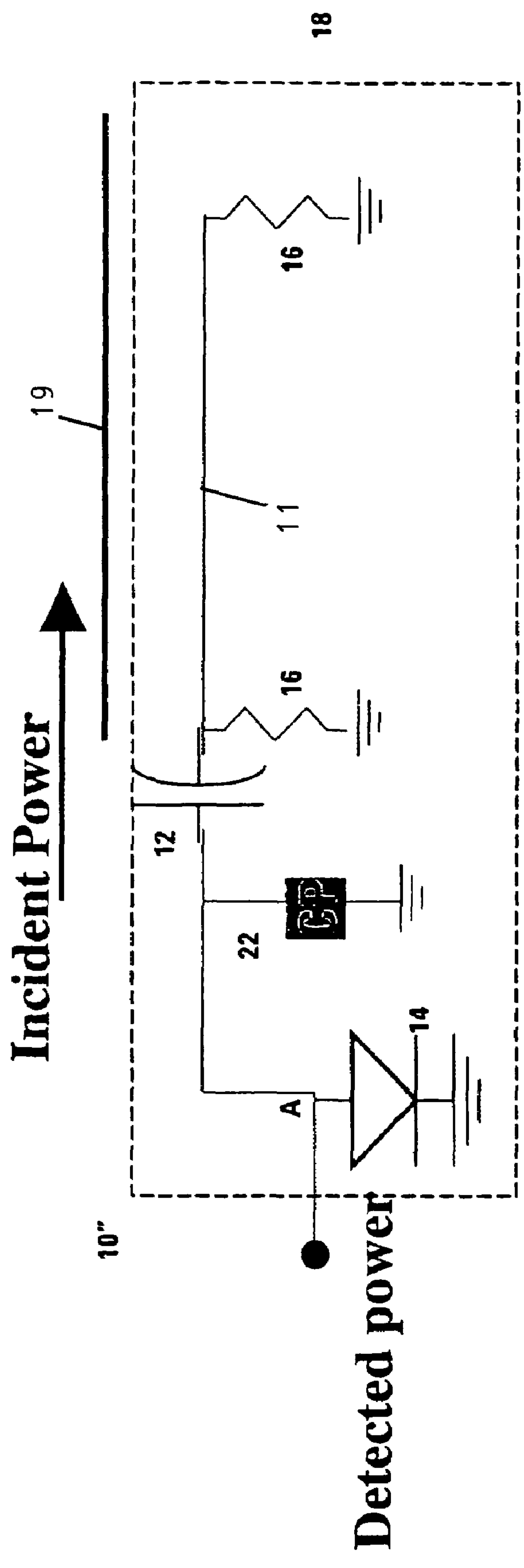
FIG. 6 illustrates an alternate embodiment of the present invention.

FIGS. 5 and 6 disclose embodiments where amplification is used to trade off the loss in coupler for the current required by this amplification, reducing the overall requirement for transmission.

FIG. 5 illustrates an alternate embodiment of the present invention 10'. A linear amplifier 20 serially connects between a conductor 11 and a capacitor 12. Terminating resistors 16 are added as needed. All of the components are integrated on a unitary substrate 18.

In operation, the linear amplifier 20 amplifies the output signal of the coupler allowing for a coupler with less coupling, and thus less loss. FIG. 6 illustrates an alternate embodiment of the present invention 10". A capacitor 12 serially connects to a detector diode 14 at node A. A charge pump 22 connects to the node A. Terminating resistors 16 are added as needed. All of the components are integrated on a unitary substrate 18.

In operation, the charge pump 22 increases the voltage at node A. This compensates for the possibly lower coupling of an integrated coupler.

The invention claimed is:

1. A circuit, comprising:

a semiconductor substrate, comprising:

a first conductor;

a detector electrically connected to the first conductor;

a second conductor above the substrate and aligned with the first conductor, wherein the first and the second conductors form a coupler that detects a power delivered into the second conductor.

2. A circuit, as defined in claim 1, wherein the semiconductor substrate is selected from a group that includes silicon and gallium arsenide.

3. A circuit, as defined in claim 1, wherein the semiconductor substrate further comprises a capacitor electrically connected in series between the first conductor and the detector.

4. A circuit, as defined in claim 3, wherein the semiconductor substrate further comprises a power amplifier electrically connected in series between the first conductor and the capacitor.

5. A circuit, as defined in claim 4, wherein the semiconductor substrate further comprises a charge pump, the capacitor and the charge pump being electrically connected in parallel to the detector.

* * * * *

UNITED STATES PATENT AND TRADEMARK OFFICE

CERTIFICATE OF CORRECTION

PATENT NO. : 7,187,062 B2
APPLICATION NO. : 10/824696
DATED : March 6, 2007
INVENTOR(S) : Michael Frank It is certified that error appears in the above-identified patent and that said Letters Patent is hereby corrected as shown below:

(Column 4 Line 22) In Claim 5, delete “claim 4” and insert -- claim 3 --, therefor.

Signed and Sealed this

Second Day of December, 2008

JON W. DUDAS
*Director of the United States Patent and Trademark Office*